United States Patent
Guo et al.

(10) Patent No.: US 9,421,620 B2
(45) Date of Patent: Aug. 23, 2016

(54) MINIATURE DRILL

(71) Applicant: SHENZHEN JINZHOU PRECISION TECHNOLOGY CORP., Shenzhen (CN)

(72) Inventors: Qiang Guo, Shenzhen (CN); Lianyu Fu, Shenzhen (CN)

(73) Assignee: SHENZHEN JINZHOU PRECISION TECHNOLOGY CORP., Shenzhen (CN)

(*) Notice: Subject to any disclaimer, the term of this patent is extended or adjusted under 35 U.S.C. 154(b) by 22 days.

(21) Appl. No.: 14/389,765

(22) PCT Filed: Jul. 17, 2014

(86) PCT No.: PCT/CN2014/082392
§ 371 (c)(1),
(2) Date: Sep. 30, 2014

(87) PCT Pub. No.: WO2015/027775
PCT Pub. Date: Mar. 5, 2015

(65) Prior Publication Data
US 2015/0209874 A1  Jul. 30, 2015

(30) Foreign Application Priority Data
Aug. 26, 2013 (CN) .......................... 2013 1 0375663

(51) Int. Cl.
B23B 35/00 (2006.01)
B23B 51/02 (2006.01)
H05K 3/00 (2006.01)

(52) U.S. Cl.
CPC ............... B23B 51/02 (2013.01); H05K 3/0047 (2013.01); B23B 2251/043 (2013.01); B23B 2251/406 (2013.01); B23B 2251/408 (2013.01); B23B 2251/426 (2013.01); Y10T 408/9097 (2015.01)

(58) Field of Classification Search
CPC .................. B23B 2251/043; B23B 2251/406; B23B 2251/408; B23B 2251/426; B23B 51/02; Y10T 8/905; Y10T 8/906; Y10T 8/9065; Y10T 8/909; Y10T 8/9095; Y10T 8/90974

USPC .......................... 408/223–225, 227, 229–230
See application file for complete search history.

(56) References Cited

U.S. PATENT DOCUMENTS

| 361,522 A | * | 4/1887 | Irwin ..................... B27G 15/00 408/213 |
| 2,370,706 A | * | 3/1945 | Andreasson ............ B23B 51/02 408/230 |

(Continued)

FOREIGN PATENT DOCUMENTS

| CN | 101791717 | 8/2010 |
| CN | 103433535 | 12/2013 |

(Continued)

OTHER PUBLICATIONS

Machine Translation of JP 2002-144122, pp. 4-9, Dec. 16, 2015.*

(Continued)

*Primary Examiner* — Daniel Howell
*Assistant Examiner* — Nicole N Ramos
(74) *Attorney, Agent, or Firm* — Hamre, Schumann, Mueller & Larson, P.C.

(57) ABSTRACT

The present invention relates to the field of manufacture of miniature drills and discloses a miniature drill, which includes a drill body, a drill tip formed at one end of the drill body, and a plurality of spiral chip slots spiraling on a surface of the drill body; the chip slots include a long chip slot, a short chip slot, and a communicating chip slot, the long chip slot and the short chip slot are arranged at intervals and have the same helix angles, and the long chip slot is communicated with the short chip slot by the communicating slot. In the miniature drill provided by the present invention, the long chip slot and the short chip slot that have the same helix angle and do not intersect are communicated with each other by the communicating slot, which effectively avoids swing of the drill tip caused by deviation of the centroid from the rotation axis and affecting the position accuracy of the drilled holes; moreover, the communicating slot broadens the widths of the chip slots, increases the chip space, and thereby improves the heat dissipating property; furthermore, the communicating slot reduces the width of the body clearance and reduces heat generated by friction between the body clearance and walls of the drilled holes, which enhances the ability of resisting breaks caused by the thermal deformation of the miniature drill.

16 Claims, 4 Drawing Sheets

(56) References Cited

U.S. PATENT DOCUMENTS

| | | | | |
|---|---|---|---|---|
| 2,912,887 | A | * | 11/1959 | Andreasson ............ B23B 51/06 |
| | | | | 408/230 |
| 4,274,771 | A | * | 6/1981 | Nishimura .............. B23B 51/08 |
| | | | | 407/53 |
| 5,553,682 | A | * | 9/1996 | Batliner ................ E21B 10/445 |
| | | | | 175/395 |
| 6,419,561 | B1 | * | 7/2002 | George ................... B23B 51/02 |
| | | | | 451/48 |
| 2005/0205306 | A1 | * | 9/2005 | Miyanaga ............... B23B 51/02 |
| | | | | 175/323 |
| 2013/0170920 | A1 | * | 7/2013 | Ogawa ................... B23B 51/02 |
| | | | | 408/1 R |

FOREIGN PATENT DOCUMENTS

| | | | |
|---|---|---|---|
| CN | 203470988 | | 3/2014 |
| JP | 2002144122 A | * | 5/2002 |
| JP | 2003-025126 | | 1/2003 |
| JP | 2009190116 A | * | 8/2009 |
| JP | 2010162643 A | * | 7/2010 |
| JP | 4608062 | | 1/2011 |

OTHER PUBLICATIONS

International Search Report of PCT/CN2014/082392 dated Oct. 20, 2014 (2 pages total).

* cited by examiner

MINIATURE DRILL

TECHNICAL FIELD

The present invention relates to fields of manufacture of miniature drills, and more particularly relates to a miniature drill for drilling printed circuit boards.

BACKGROUND

With the rapid development of technology and products of printed circuit boards (PCBs), the demand for carbide drills increases year and year, new carbide drills appear ceaselessly, and requirements for carbide drills become higher and higher. A carbide drill for PCBs (referred to as "PCB micro-drill") is a microporous machining tool in a complex shape and with spiral slots, and is derived from a traditional twist drill. The size of a PCB micro-drill is small, and the structure of a distal end of the drill needs to be clearly observed by means of an optical microscope. Currently, most PCB manufacturers use CNC drilling machines to process PCBs, wherein a CNC drilling process is an important step of a PCB manufacturing process, and a carbide drill is a key factor to decide the quality and efficiency of the drilling process.

An existing miniature drill mainly makes its two spiral slots intersect by changing their helix angles, wherein one method is to increase the helix angles to make the two slots intersect, and another method is to reduce the helix angles to make the two slots intersect. After the two slots intersect, the slots may stop or go in parallel from the intersection place. The main characteristic of these two intersection methods is that the two spiral slots intersect near the drill tip or the drill body, but which may cause a problem that: the centroid of the drill tip near the intersection portion of the spiral slots of the drill tip is offset; when the drill rotates at a high speed, the drill tip will swing violently due to the deviation of the centroid from the rotation axis, which may seriously affect the position accuracy of the drilled holes and the anti-break performance during drilling.

SUMMARY

The object of the present invention is to provide a miniature drill for drilling printed circuit boards, which is used to solve the defect that a miniature drill in the prior art often cuts one of the cutting edges thereof by offsetting the position of one of the chip slots thereof and makes the chip slots not intersect each other, or changes the helix angle of one of the chip slots to make the chip slot intersect with another chip slot, which may cause deviation of the centroid of the drill tip near the intersection from the rotation axis and result in big swing of the drill tip, and thus the position accuracy of the drilled holes may be severely affected.

The present is achieved as follow: a miniature drill is disclosed, wherein the miniature drill includes a drill body, a drill tip formed at one end of the drill body, and a plurality of spiral chip slots spiraling on the surface of the drill body, the chip slots include at least one long chip slot, at least one short chip slot, and at least one communicating slot, the long chip slot and the short chip slot are arranged at intervals and have the same helix angle, and the long chip slot is communicated with the short chip slot by the communicating slot.

The drill tip is provided with a cutting edge, and the cutting edge includes two main cutting edges, two main cutter surfaces, and two auxiliary cutter surfaces that are all symmetrically arranged along the central axis of the drill body. Since the drill tip of the miniature drill is arranged completely symmetrical as the conventional miniature drills, when the miniature drill is used for cutting, the drill tip is exerted by balance force, which avoids the defect that radial force is generated due to a single edge of a drill tip of a single cutting edge suffering uneven force and thus the position accuracy and the hole roughness of the drilled holes are affected; compared with a cutting edge drill with a single edge, such a design greatly improves the wear resistance of the cutting edges, in the same cutting amount and cutting speed, the original cutting amount of a single cutting edge is shared by two cutting edges, so that the feed of each of the two cutting edges is equivalent to half of the feed of the single cutting edge. Therefore, the miniature drill has higher wear resistance, the hole roughness of which is relatively better, and the working life of which is longer.

The long chip slot extends from the position of the drill tip to a distal end of the drill body.

The short chip slot is arranged on a front portion of the drill body, and the short chip slot extends from the position of the drill tip to a distal end of the front portion of the drill body.

The length of the short chip slot is less than or equal to 70% of the length of the long chip slot.

The communicating slot starts from a margin position between the long chip slot and the short chip slot, extends in company with the long chip slot, and ends at an end of the long chip slot. The communicating slot extends in company with the long chip slot to the end of the long chip slot along by changing its helix angle, which increases a ratio of a width of a chip slot to a width of a land, that is, a slot land ratio: a ratio of the width of the chip slot at a certain position of the drill body to the width of the land, and thereby enhances the anti-break performance of the miniature drill, broadens the width of the chip slot, and makes the drilling chips be not prone to adhere to the drill body.

In one embodiment, the helix angle of the communicating slot at the margin position between the long chip slot and the end position of the short chip slot is greater than the helix angle of the long chip slot and the helix angle of the short chip slot. Such a design makes the communicating slot formed at the margin position between the long chip slot and the short chip slot communicate with the long chip slot and the short chip slot slowly.

In another embodiment, the helix angle of the communicating slot at the margin position between the long chip slot and the end position of the short chip slot is smaller than the helix angle of the long chip slot and the helix angle of the short chip slot. Such a design makes the communicating slot at the margin position between the long chip slot and the short chip slot communicate with the long chip slot and the short chip slot quickly.

The drill body is provided with a plurality of communicating slots.

Further, each of the communicating slots is offset and distributed continuously, which can further reduce the degree of deviation of the centroid of the drill tip from the central axis, and increase the position accuracy of the drilled holes.

Compared with the prior art, in the miniature drill provided by the present invention, the long chip slot and the short chip slot that have the same helix angle and do not intersect are communicated by the communicating slot, which effectively avoids the swing of the drill tip caused by the deviation of the centroid from the rotation axis and affecting the position accuracy of the drilled holes. Moreover, the communicating slot broadens the width of the chip slots, increases the chip space, and improves the heat dissipating property; furthermore, the communicating slot reduces the width of the body clearance and thus reduces heat generated by friction between the body clearance and walls of the drilled holes, which enhances the ability of resisting breaks caused by thermal deformation of the miniature drill.

DETAILED DESCRIPTION OF THE PREFERRED EMBODIMENTS

In order to make the purpose technical solutions and the advantages of this application more clearly, the present invention will be explained below in detail referencing to the accompany drawings and embodiments. It should be appreciated that the embodiment(s) described following are merely to explain this application but is no way intended to limit the invention.

Specifically, the present invention will be described in detail below with reference to drawings.

A conventional miniature drill often cuts one of its cutting edges by offsetting the position of one of its chip slots and thereby makes the chip slots not intersect each other, or changes the helix angle of one of the chip slots to make the chip slot intersect with another chip slot; such designs may cause the deviation of the centroid of the drill tip near the intersection from the rotation axis and result in big swing of the drill tip, and thus the position accuracy of the drilled holes may be affected. The present invention provides a miniature drill, in which a long chip slot and a short chip slot having the same helix angle and paralleling each other are communicated with each other by a communicating slot. Thus, not only is the communication of the two chip slots achieved, but also the centroid is ensured to not deviate from the rotation axis, and the position accuracy of the drilled holes is further ensured.

The technical solution of the present invention can be applied to any miniature drill with two or more cutting edges, and a miniature drill with two edges, two slots, and a diameter below 6.5 mm is used as an example to interpretation this invention.

Figure 1A:
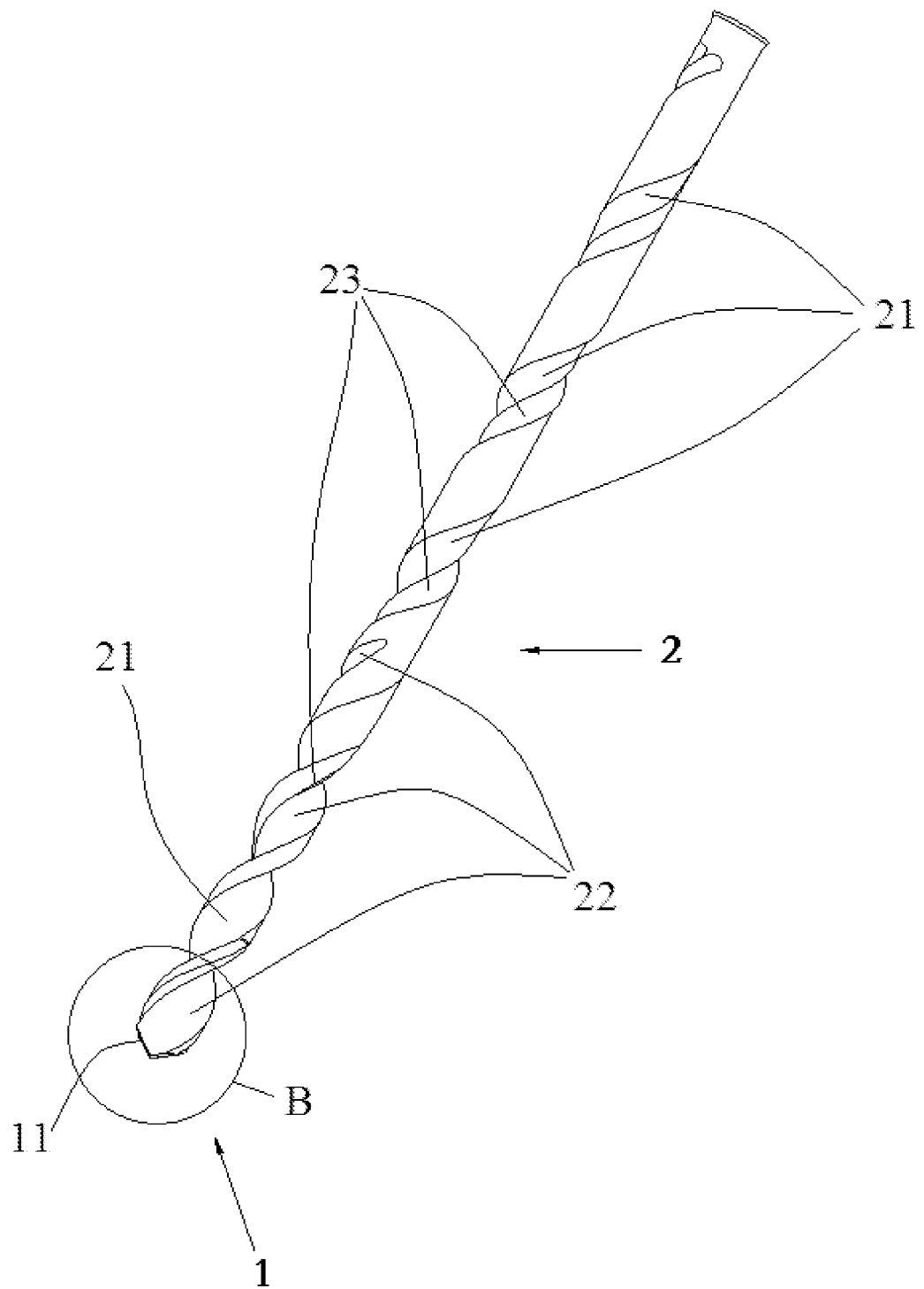
FIG. 1A is a stereo schematic view of a miniature drill in accordance with one embodiment of the present invention.

As shown in FIG. 1A, the miniature drill of the present embodiment includes a drill body 2, a drill tip 1 formed at one end of the drill body 2, and a plurality of spiral chip slots spirally arranged on a surface of the drill body 2; wherein the chip slots includes at least one long chip slot 21, at least one short chip slot 22, and at least one communicating chip slot 23, the long chip slot 22 and the short chip slot 21 are arranged at interval and have the same helix angle, meanwhile, the long chip slot 21 and the short chip slot 22 are communicated by the communicating slot 22.

Using the above miniature drill to cut and drill a PCB has the following characteristics:

1) adopting the design of dual slots having the same helix angle, and extending in company with each other and at interval; in this design, the long chip slot 21 extends in company with the short chip slot 22 at interval and has the same helix angle as the short chip slot 22, which ensures that the centroid of the whole miniature drill does not deviate from the rotation axis, and effectively avoids the swing of the drill tip caused by deviation of the centroid from the rotation axis and affecting the position accuracy of the drilled holes, and thus enhances the position accuracy of the drilled holes;

2) using the communicating slot to communicate the long chip slot with the short chip slot; in this design, the communicating slot cuts the body clearance between the long chip slot and the short chip slot, broadens the chip space of the miniature drill, and makes the drilling chips be discharged in several routes. In this way, the drilling chips can be quickly discharged, which is propitious to dissipation of the cutting heat and effectively reduces the temperature of the drill tip when it is used for cutting. Thus, the drill tip is protected, the service life is extended, and the cost is saved.

Figure 1B:
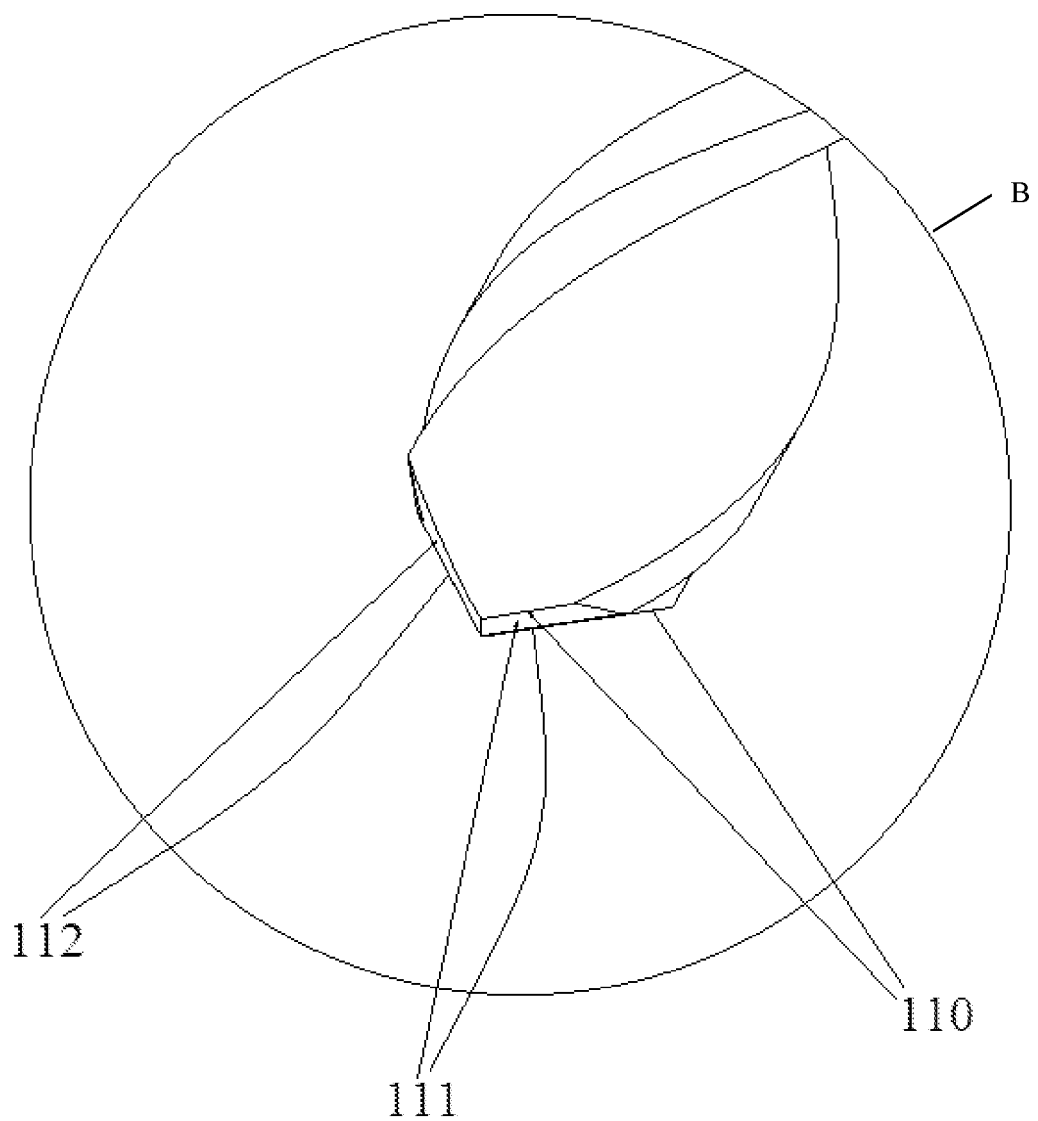
FIG. 1B illustrates a zoom-in view of B of FIG. 1A.
Figure 2:
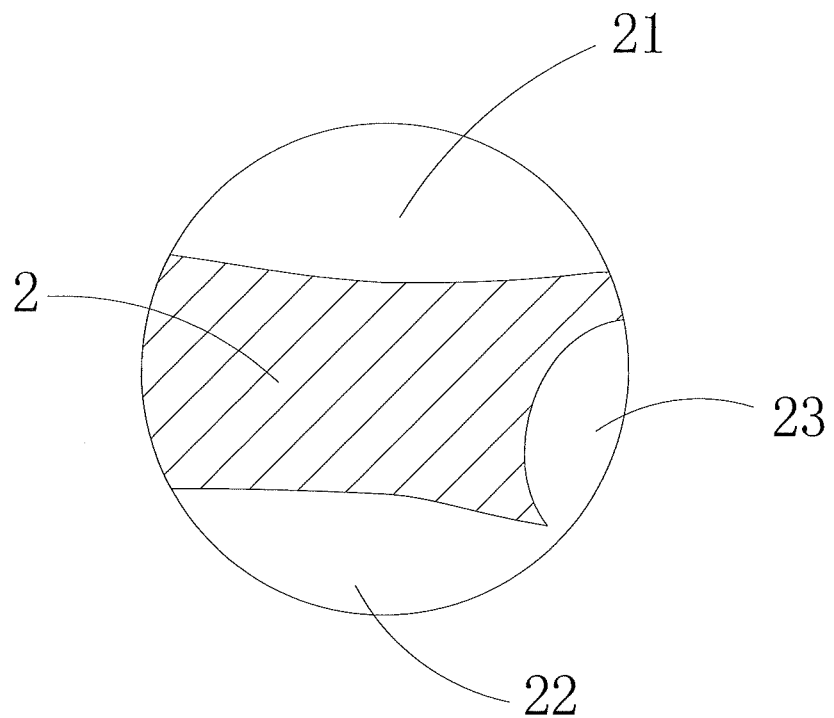
FIG. 2 is a communicated cross-sectional schematic view of the communicating slot and the short chip slot in the embodiment shown in FIG. 1.
Figure 3:
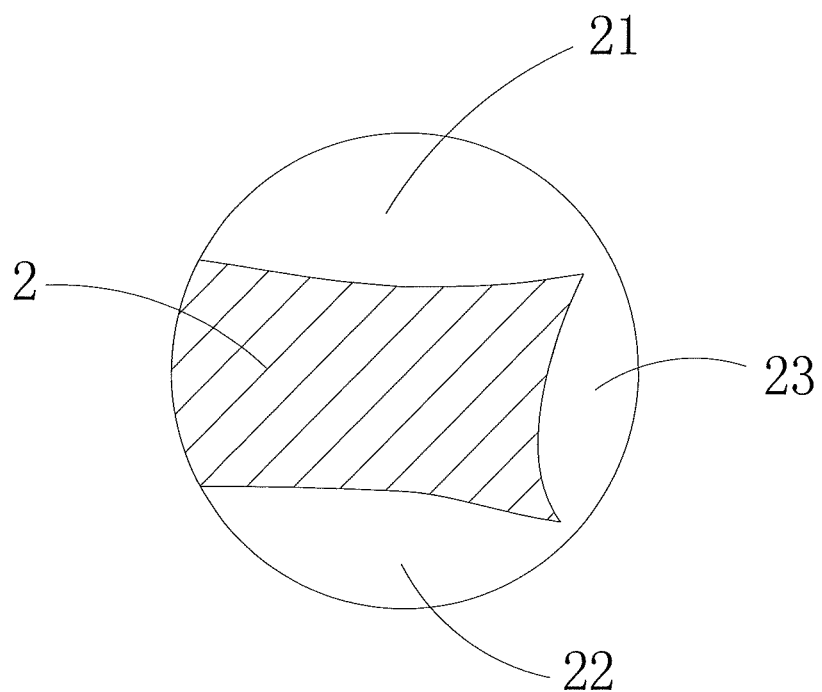
FIG. 3 is a communicated cross-sectional schematic view of the communicating slot, the short chip slot, and the long chip slot in the embodiment shown in FIG. 1.
Figure 4:
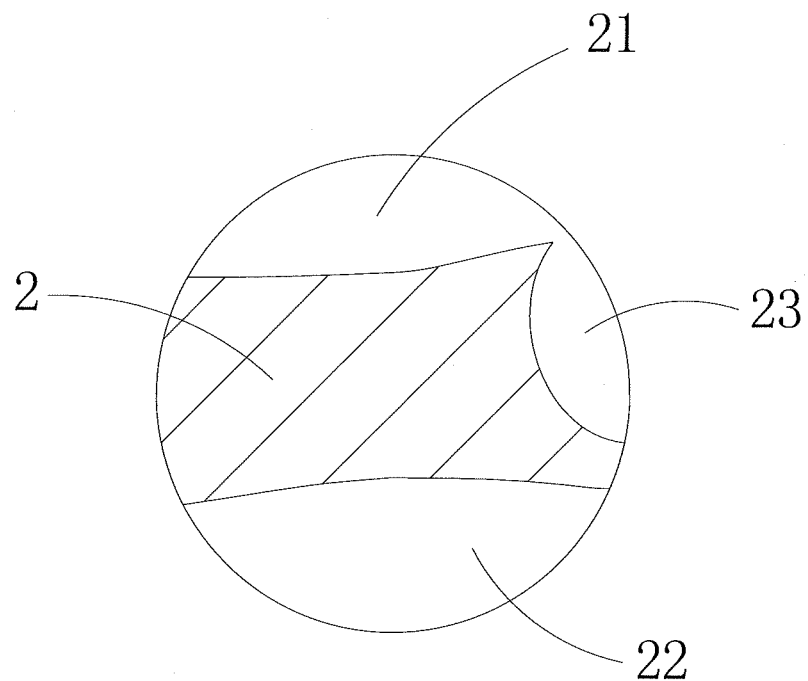
FIG. 4 is a communicated cross-sectional schematic view of the communicating slot and the long chip slot in the embodiment shown in FIG. 1.
Figure 5:
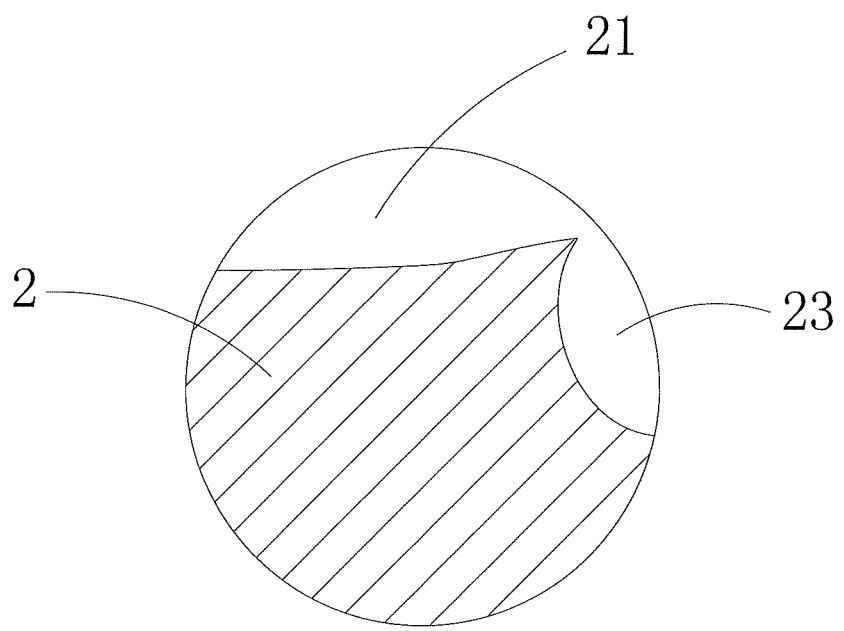
FIG. 5 is a cross-sectional schematic view of the communicating slot and the end position of the long chip slot in the embodiment shown in FIG. 1.

In this embodiment, the drill tip 1 is provided with a cutting edge 11. With reference to FIG. 1B, the cutting edge 11 includes two main cutting edges 110, two main cutter surfaces 111, and two auxiliary cutter surfaces 112; wherein the main cutting edges 110, the main cutter surfaces 111, and the auxiliary cutter surfaces 112 are all symmetrically arranged along the central axis of the drill body 2, and this structure of the drill tip is identical with the structure of a conventional drill tip. Since the drill tip of the miniature drill of the present embodiment is arranged completely symmetrical as that of the conventional miniature drill, when the miniature drill is used for cutting, the drill tip is exerted by balance force, which avoids the defect that radial force is generated due to a single edge of a drill tip of a single cutting edge suffering uneven force and thus the position accuracy of the drilled holes and the hole roughness are affected. Compared with a cutting edge drill with a single edge, such a design of the drill tip greatly improves the wear resistance of the cutting edges, in the same cutting amount and cutting speed, the original cutting amount of a single cutting edge is shared by two cutting edges, so that the feed of each of the two cutting edges is equivalent to half of the feed of the single cutting edge. Therefore, the miniature drill has higher wear resistance, the hole roughness of which is relatively better, and the working life of which is longer.

The long chip slot 21 extends from the position of the drill tip 1 to the end of the drill body 2, and its helix angle is constant. The short chip slot 22 is arranged on a front portion of the drill body 2, extends from the position of the drill tip 1, and ends at a front position of the drill body 2, wherein the front position is the end of the front portion of the drill body 2; the helix angle of the short chip slot 22 is also constant, and the long chip slot 21 and the short chip slot 22 have the same helix angle and extend in company with each other at interval to the end of the short chip slot 22. Such a design including dual slots, the same helix angle, and extending in company ensures that the centroid of the whole miniature drill does not deviate from the axis of the drill body 2, effectively avoids swing of the drill tip 1 caused by deviation of the centroid from the axis and affecting the position accuracy of the drilled holes, and thus enhances the position accuracy of the drilled holes and ensures the hole roughness. Of course, depending on the circumstances and the actual needs, in other embodiments, the short chip slot 22 can also end at other positions of the drill body 2, such as the middle portion of the drill body 2, or the like.

The length of the short chip slot 22 is less than or equal to 70% of the length of the long chip slot 21. Such a length design is more suitable for the situation of higher requirement for hole roughness of the drilled holes, or the situation that the drilling chips of the board material are difficult to be discharged, for example, the glass transition temperature is low, the drilling chips are easy to form a molten state, etc., in which sufficient space for discharging the drilling chips is required, that is, two slots are needed to discharge the drilling chips simultaneously, but the lengths of the slots of the miniature drill need to be longer, which makes the drill be prone to be broken at its bottom during processing. Of course, depending on the circumstances and the actual needs, in other embodiments, the short chip slot 22 and long chip slot 23 can also adopt other lengths.

In this embodiment, the communicating slot 23 starts from a position of a margin between the long chip slot 21 and the short chip slot 22, ends at an end of the long chip slot 21, and extends in company with and spirals along the long chip slot 21. In the extending and spiraling process of the communicating slot 23, the communicating slot 23 cuts off the margin between an end of the short chip slot 22 and the long chip slot 21 to communicate the short chip slot 22 with the long chip slot 21, and then the communicating slot 23 extends in company with and spirals along the long chip slot 21 to the end of the long chip slot 21.

The communicating slot 23 changes its helix angle to communicate the long chip slot 21 with the short chip slot 22, in this embodiment, the helix angle of the communicating slot 23 is larger than the helix angle of the long chip slot 21 and the helix angle the short chip slot 22, specifically, that is: the helix angle of the communicating slot 23 at the margin position between the long chip slot 21 and the end position of the short chip slot 22 is greater than the helix angle of the long chip slot 21 and the helix angle of the short chip slot 22, so that the long chip slot 21 and the short chip slot 22 can be communicated slowly. Of course, according to the actual situation, in another embodiment, the helix angle of the communicating slot 23 can be smaller than the helix angle of the long chip slot 21 and the helix angle of the short chip slot 22, that is, the helix angle of the communicating slot 23 at the margin position between the long chip slot 21 and the end position of the short chip slot 22 is smaller than the helix angle of the long chip slot 21 and the helix angle of the short chip slot 22, so that the long chip slot 21 and the short chip slot 22 can be communicated quickly.

As shown in FIG. 2 to FIG. 5, the process of communicating the chip slot 23 with the long chip slot 21 and the short chip slot 22 is as follows:

first, the communicating slot 23 is communicated with the short chip slot 22, and is isolated from the long chip slot 21;

second, the communicating slot 23 is communicated with the long chip slot 21 and the short chip slot 22 simultaneously;

third, the communicating slot 23 is communicated with the long chip slot 21 and is isolated from the short chip slot 22, and then the short chip slot 22 ends;

finally, the communicating slot 23 and the long chip slot 21 are communicated with each other, and extend in company with each other to the end of the long chip slot 21.

After the communicating slot 23 changes its helix angle to be communicated with the short chip slot 22 and the long chip slot 21, the communicating slot 23 extends in company with the long chip slot 21 to the distal end of the long chip slot 21, so that a slot land ratio, that is, a ratio of a width of a chip slot at a certain position of the drill body 2 to a width of a land, is reduced, which enhances the anti-break performance of the miniature drill, broadens the width of the chip slot, and makes the drilling chips be not prone to adhere to the drill body 2.

The communicating slot 23 is arranged on the body clearance between the long chip slot 21 and the short chip slot 22, which reduces the width of the body clearance and thereby reduces heat generated by friction between the body clearance and walls of the drilled holes, and further reduces the cutting temperature of the drill tip, extends the service life of the miniature drill, and saves the using cost.

This embodiment uses a single communication slot 23; of course, in other embodiments, according to actual situations and needs, a plurality of communication slots 23 may be employed, and each of the communicating slots 23 is continuously offset and distributed on the body clearance between the long chip slot 21 and the short chip slot 22, in this way, not only are the technical effects described in the previous paragraph met, but also the degree of deviation of the centroid from the central axis can be further reduced and the hole position accuracy of the drilled holes can be further improved.

The above-mentioned description is only a preferred embodiment of the present invention which is not therefore limit the patent range of the present invention. Any equivalent structures or equivalent processes transform or the direct or indirect use in other related technical fields made by the specification and the FIG.s of the present invention are similarly included the range of the patent protection of the present invention.

What is claimed is:

1. A miniature drill, comprising: a drill body, a drill tip formed at one end of the drill body, and a plurality of spiral chip slots spiraling on a surface of the drill body;

wherein the chip slots include at least one long chip slot, at least one short chip slot, and at least one communicating slot, the at least one long chip slot and the at least one short chip slot are arranged at interval and have the same helix angle, and the at least one long chip slot is communicated with the at least one short chip slot by the communicating slot, wherein the communicating slot is entirely a concave formed on the surface of the drill body.

2. The miniature drill of claim 1, wherein the drill tip is provided with a cutting edge, and the cutting edge includes two main cutting edges, two main cutter surfaces, and two auxiliary cutter surfaces that are all symmetrically arranged along a central axis of the drill body.

3. The miniature drill of claim 2, wherein the at least one long chip slot extends from the position of the drill tip to an end of the drill body.

4. The miniature drill of claim 3, wherein the at least one short chip slot is arranged on a front portion of the drill body, and the at least one short chip slot extends from the position of the drill tip to an end of the front portion of the drill body.

5. The miniature drill of claim 4, wherein the length of the short chip slot is less than or equal to 70% of the length of the long chip slot.

6. The miniature drill of claim 1, wherein the at least one communicating slot starts from a margin position between the at least one long chip slot and the at least one short chip slot, extends in company with the at least one long chip slot, and ends at an end of the at least one long chip slot.

7. The miniature drill of claim 6, wherein a helix angle of the at least one communicating slot at the margin position between the at least one long chip slot and the end position of the at least one short chip slot is greater than the helix angle of the at least one long chip slot and the helix angle of the at least one short chip slot.

8. The miniature drill of claim 6, wherein a helix angle of the at least one communicating slot at the margin position between the at least one long chip slot and the end position of the at least one short chip slots is smaller than the helix angle of the at least one long chip slots and the helix angle of the at least one short chip slot.

9. The miniature drill of claim 1, wherein one or more communicating slots are arranged on the drill body.

10. The miniature drill of claim 9, wherein each of the communicating slots is offset and distributed continuously.

11. The miniature drill of claim 1, wherein a part of the surface of the drill body located in the communicating slot is entirely lower than two opposite edges of the communicating slot.

12. The miniature drill of claim 1, wherein a first part of the at least one communicating slot is communicated with the at least one short chip slot but isolated from the at least one long chip slot, a second part of the at least one communicating slot is communicated with the at least one short chip slot and is also communicated with the at least one long chip slot, and a third part of the at least one communicating slot is isolated from the at least one short chip slot but communicated with the at least one long chip slot.

13. The miniature drill of claim 1, wherein
the at least one communicating slot is communicated with the short chip slot, and is isolated from the long chip slot;
the at least one communicating slot is communicated with the long chip slot, and is also communicated with the short chip slot;
the at least one communicating slot is communicated with the long chip slot and is isolated from the short chip slot, and then the short chip slot ends; and
the at least one communicating slot and the long chip slot are communicated with each other, and extend with each other to the end of the long chip slot.

14. The miniature drill of claim 1, wherein the communicating slot is configured to increase widths of the long chip slot and the short chip slot that in turn increase a chip space of the miniature drill.

15. The miniature drill of claim. 1, wherein the communicating slot is configured to reduce a width of a body clearance of the drill body.

16. The miniature drill of claim 1, wherein the communicating slot cuts a body clearance between the long chip slot and the short chip slot.

\* \* \* \* \*